(12) United States Patent
Tretter et al.

(10) Patent No.: US 11,165,424 B2
(45) Date of Patent: Nov. 2, 2021

(54) FIELD-EFFECT TRANSISTOR ARRANGEMENT AND METHOD FOR SETTING A DRAIN CURRENT OF A FIELD-EFFECT TRANSISTOR

(71) Applicant: Robert Bosch GmbH, Stuttgart (DE)

(72) Inventors: Gregor Tretter, Walddorfhaeslach (DE); Reiner Schnitzer, Reutlingen (DE); Thomas Schwarzenberger, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 16/769,406

(22) PCT Filed: Oct. 23, 2018

(86) PCT No.: PCT/EP2018/079008
§ 371 (c)(1),
(2) Date: Jun. 3, 2020

(87) PCT Pub. No.: WO2019/110192
PCT Pub. Date: Jun. 13, 2019

(65) Prior Publication Data
US 2020/0304118 A1    Sep. 24, 2020

(30) Foreign Application Priority Data

Dec. 8, 2017   (DE) .......................... 102017222284.0

(51) Int. Cl.
| H03K 17/687 | (2006.01) |
| H03F 1/02 | (2006.01) |
| H03G 3/00 | (2006.01) |

(52) U.S. Cl.
CPC ......... *H03K 17/687* (2013.01); *H03F 1/0205* (2013.01); *H03G 3/004* (2013.01); *H03F 2200/453* (2013.01); *H03F 2200/75* (2013.01)

(58) Field of Classification Search
CPC .. H03K 17/161; H03K 17/162; H03K 17/687; H03K 17/6871; H03K 17/7878;
(Continued)

(56) References Cited

U.S. PATENT DOCUMENTS

| 4,346,344 A * | 8/1982 | Blauschild .............. G05F 3/245 257/392 |
| 4,791,318 A | 12/1988 | Lewis et al. |

(Continued)

OTHER PUBLICATIONS

International Search Report for PCT/EP2018/079008, dated Feb. 12, 2019.

*Primary Examiner* — Long Nguyen
(74) *Attorney, Agent, or Firm* — Norton Rose Fulbright US LLP; Gerard Messina

(57) ABSTRACT

A field-effect transistor system is provided that comprises a field-effect transistor having a back-gate terminal that can be adjusted by a back-gate voltage, a gate-source voltage and a drain-source voltage additionally being present at the field-effect transistor, and a drain current flowing through the field-effect transistor. In addition, the field-effect transistor system includes a control unit connected to the back-gate terminal, which unit is set up to set the drain current flowing through the field-effect transistor to a setpoint current via a controlling of the back-gate voltage at the back-gate terminal, the controlling of the back-gate voltage taking place as a function of at least the gate-source voltage. In addition, a method is provided for setting a drain current of a field-effect transistor.

16 Claims, 2 Drawing Sheets

(58) Field of Classification Search
CPC .......... H03K 17/6877; H03K 19/0027; H03K 2217/0018; H03F 1/0205; H03F 1/0211; H03F 1/0216; H03F 2200/72; H03F 2200/75; H03F 2200/78; H03G 3/004; G05F 3/205; G11C 5/146; G11C 11/4074; H02M 3/078

See application file for complete search history.

(56) References Cited

U.S. PATENT DOCUMENTS

| | | | |
|---|---|---|---|
| 5,132,752 | A | 7/1992 | Umemoto et al. |
| 5,422,591 | A * | 6/1995 | Rastegar ............... G05F 3/24 327/409 |
| 6,680,650 | B2 * | 1/2004 | Gupta ................... H03F 1/301 327/534 |
| 6,774,705 | B2 * | 8/2004 | Miyazaki ......... H03K 19/00384 327/534 |
| 7,675,348 | B2 * | 3/2010 | Sumita ............ H03K 19/00384 327/534 |
| 2009/0146723 | A1 | 6/2009 | Kimura |
| 2010/0026391 | A1 | 2/2010 | Brekelmans et al. |

* cited by examiner

FIELD-EFFECT TRANSISTOR ARRANGEMENT AND METHOD FOR SETTING A DRAIN CURRENT OF A FIELD-EFFECT TRANSISTOR

FIELD

The present invention relates to a field-effect transistor system, and to a method for setting a drain current of a field-effect transistor.

BACKGROUND INFORMATION

Due to parasitic effects, in field-effect transistors the drain current $I_D$ increases in the saturation region, also referred to as the pinch-off region, as the drain source voltage $V_{DS}$ increases. In CMOS processes, this undesirable behavior increases as transistor scaling increases, and as a result the output characteristic curve fields of, for example, modern CMOS field-effect transistors show a significant rise; see also FIG. 1 of the related art.

Disadvantageously, the described effect causes a reduction of the small signal drain-source resistance $r_{DS}$ and thus also a reduction in the intrinsic gain $A_i$ of the field-effect transistor. The intrinsic gain of the field-effect transistor describes the maximum voltage gain that the field-effect transistor can achieve at a particular operating point. For a field-effect transistor in a source circuit having a high-ohmic load, this is calculated from the product of the so-called small signal steepness $g_m$ and the small signal drain-source resistance $r_{DS}$. High values of this variable are important for applications that require high gain or a high degree of accuracy.

Using complex circuit topologies having a plurality of field-effect transistors, amplifier circuits having high voltage gain can be designed that have field-effect transistors having low intrinsic gain. However, this requires the stacking of a plurality of field-effect transistors, which is difficult or impossible in scaled CMOS technologies due to the low supply voltage. The combination of the two effects, namely the strong $I_D(V_{DS})$ functional relationship and the low supply voltage, have the result that a high voltage gain cannot be achieved in scaled CMOS processes, or can be achieved only with a significant outlay.

SUMMARY

According to the present invention, an example field-effect transistor system is provided that includes a field-effect transistor having a back-gate terminal that can be adjusted by a back-gate voltage, a gate-source voltage and a drain-source voltage being in addition present at the field-effect transistor, and a drain current flowing through the field-effect transistor. In addition, the field-effect transistor system also includes a control unit connected to the back-gate terminal, the control unit being configured to set the drain current flowing through the field-effect transistor to a setpoint current via a controlling of the back-gate voltage at the back-gate terminal, the controlling of the back-gate voltage taking place as a function of at least the gate-source voltage.

The present invention has the advantage that undesirable parasitic effects can be compensated via the controlling of the back-gate voltage. In this way, for example output characteristic curves can be produced having as constant a drain current as possible in a saturation region of the field-effect transistor (see, for example, FIG. 4), whereby the small-signal drain-source resistance is increased, thus improving the intrinsic gain of the field-effect transistor. Through the present invention, a control system or control loop is realized in which at least the gate-source voltage acts as input variable in order to control the back-gate voltage, as manipulated variable, and thus to set the drain current to a setpoint current. The present invention is particularly well-suited for field-effect transistors having a strong punch-through of the back-gate voltage to the drain current, which is the case for example in SOI or FDSOI-CMOS technologies. However, other field-effect transistors in which the drain current can be modified in sensitive fashion via a change of the back-gate voltage can preferably be used in accordance with the present invention. A field-effect transistor can for example be an IGFET, such as a MOSFET or a JFET, the present invention not being limited to a particular field-effect transistor. For example, self-conducting and self-locking field-effect transistors may both be used. The field-effect transistor system can in addition be wired, or integrated, in electrical circuits in the place of a field-effect transistor from the related art.

Preferably, the control unit is set up to also control the back-gate voltage as a function of the drain-source voltage at the field-effect transistor. In this way, the operating region of the field-effect transistor can for example be ensured, for example the linear region or the saturation region. In this way, the control unit can produce a controlling of the back-gate voltage suitable for the respective region.

Preferably, the setpoint current can be in a saturation region of the field-effect transistor independent of the drain-source voltage. In other words, the back-gate voltage is controlled by the control unit in such a way that the drain current is constant, as a function of the drain-source voltage. In this way, the intrinsic gain of the field-effect transistor system is maximized.

In a particular specific example embodiment of the present invention, the control unit can control the back-gate voltage of the field-effect transistor from a known electrical behavior of the field-effect transistor. The advantage of this embodiment is that the drain current of the field-effect transistor does not have to be explicitly ascertained. Moreover, the control unit can take over additional calibration tasks, for example in order to compensate process fluctuations. The known electrical behavior of the field-effect transistor can be provided to the control unit for example in the form of data sets stored in a memory. From this, using the data and the drain-source voltage and gate-source voltage, a corresponding correction variable can then be ascertained for the back-gate voltage.

Alternatively, the control unit can be set up to control the back-gate voltage as a function of the drain current flowing through the field-effect transistor. In this way, all electrical information, i.e. drain current, gate-source voltage, and drain-source voltage, is present for the realization of a control circuit having a reference element.

According to a preferred specific embodiment of the present invention, the field-effect transistor system includes a reference field-effect transistor to which a gate-source voltage is applied that is the same as the gate-source voltage at the field-effect transistor, a constant drain-source voltage and a constant back-gate voltage being in addition applied at the reference field-effect transistor. In this way, the drain current flowing through the reference field-effect transistor advantageously does not have any functional dependence on the drain-source voltage.

The control unit can be set up to control the back-gate voltage at the field-effect transistor in such a way that the drain current through the reference field-effect transistor is identical to the drain current through the field-effect transistor. The drain current through the reference field-effect transistor thus acts as a setpoint variable for the drain current through the field-effect transistor. In this way, using the reference field-effect transistor, an independent drain current through the field-effect transistor is set that is independent of the drain-source voltage.

In addition, an electrical circuit, in particular an amplifier circuit, is provided comprising one or more field-effect transistor systems. Electrical circuits, in particular amplifier circuits, can have improved performance due to the elimination or compensation of parasitic effects of the field-effect transistor.

The example method according to the present invention for setting a drain current of a field-effect transistor includes the following steps: in a first step, a field-effect transistor is provided with a back-gate terminal adjustable with a back-gate voltage, a gate-source voltage and a drain-source voltage in addition being applied at the field-effect transistor. In a further step, the drain current is set to a setpoint current via a controlling of the back-gate voltage at the back-gate terminal by a control unit connected to the back-gate terminal, the controlling of the back-gate voltage taking place as a function of at least the gate-source voltage and the drain-source voltage.

The advantages of the example method correspond to the advantages of the above-described field-effect transistor system.

In addition, the controlling of the back-gate voltage can also take place as a function of the drain-source voltage.

Preferably, the setpoint current in a saturation region of the field-effect transistor can be independent of the drain-source voltage.

In a particular specific embodiment of the present invention, the controlling of the back-gate voltage by the control unit can take place from a known electrical behavior of the field-effect transistor.

In addition, the example method can include the controlling of the back-gate voltage as a function of the drain current flowing through the field-effect transistor.

Preferably, the example method can include the provision of a reference field-effect transistor at which a gate-source voltage is applied that is the same as the gate-source voltage at the field-effect transistor, a constant drain-source voltage and a constant back-gate voltage being applied at the reference field-effect transistor.

In a further preferred embodiment of the present invention, the controlling of the back-gate voltage by the control unit can take place in such a way that the drain current through the reference field-effect transistor is identical to the drain current through the field-effect transistor.

Advantageous developments of the present invention are described herein.

BRIEF DESCRIPTION OF THE DRAWINGS

Exemplary embodiments of the present invention are explained in more detail on the basis of the figures and the description below.

DETAILED DESCRIPTION OF EXAMPLE EMBODIMENTS

Figure 1:
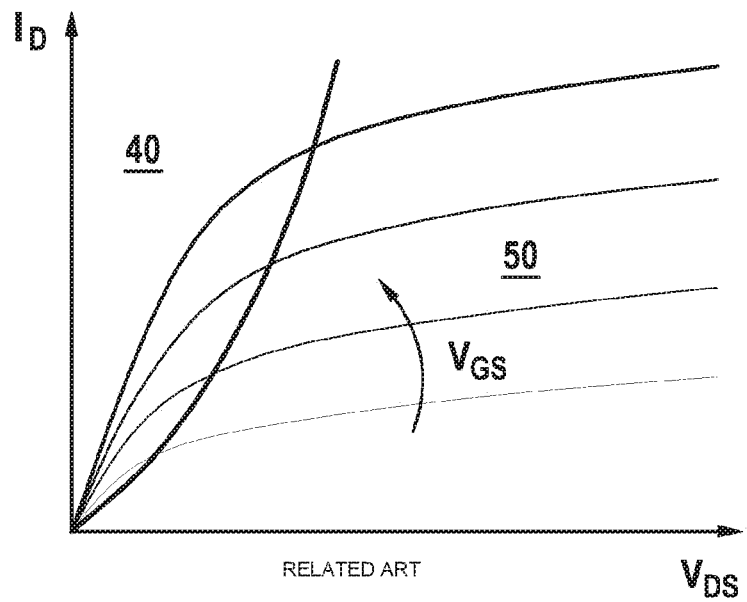
FIG. 1 shows an output characteristic curve field of a field-effect transistor from the related art.

FIG. 1 shows an output characteristic curve field of a field-effect transistor from the related art, in which a drain current $I_D$ flowing through a field-effect transistor is plotted as a function of drain-source voltage $V_{DS}$ for a multiplicity of different gate-source voltages $V_{GS}$. At the field-effect transistor according to the related art, here an adjustable but constant back-gate voltage is set at its back-gate terminal, which is not explicitly shown here. The functional curve of drain current $I_D$ for each associated gate-source voltage $V_{GS}$ shows, as a function of drain-source voltage $V_{DS}$, a linear region 40 for sufficiently small drain-source voltages $V_{DS}$ and a saturation region 50 for sufficiently large drain-source voltages $V_{DS}$; the regions are separated from one another by a separating line for clarity. The curve shown in FIG. 1 of drain current $I_D$ as a function of drain-source voltage $V_{DS}$ shows that in saturation region 50, also called the pinch-off region, the drain current continues to climb as a function of the drain-source voltage, which is undesirable and is attributable to parasitic effects. The effect disadvantageously results in a lower small signal drain-source resistance, and thus a lower intrinsic gain.

Figure 2:
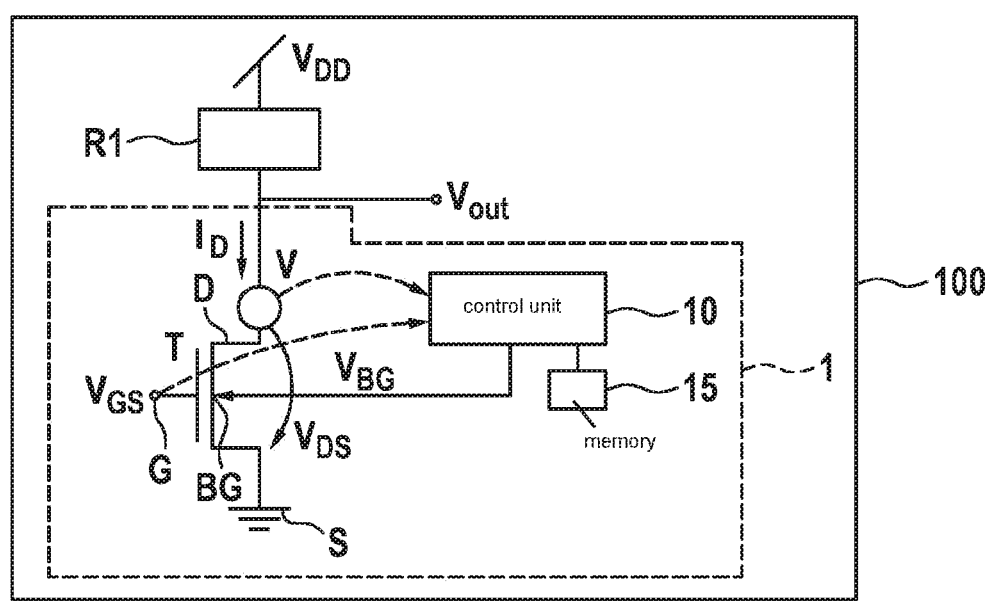
FIG. 2 shows a field-effect transistor system according to the present invention according to a first specific embodiment of the present invention.

FIG. 2 shows a field-effect transistor system 1 according to a first specific embodiment of the present invention. Here, field-effect transistor system 1 is advantageously integrated in an electrical circuit, in this specific case an amplifier circuit 100.

Field-effect transistor system 1 here includes a field-effect transistor T having a back-gate terminal BG that can be adjusted by a back-gate voltage $V_{BG}$. In addition, a gate-source voltage $V_{GS}$ and a drain-source voltage $V_{DS}$ are present at field-effect transistor T, and a drain current $I_D$ also flows through field-effect transistor T. Purely as an example, in the present embodiment a source terminal S of field-effect transistor T is grounded, so that the voltage at a gate terminal G of field-effect transistor T corresponds to gate-source voltage $V_{GS}$. However, the present invention is not limited to a grounding of source terminal S.

In addition, field-effect transistor system 1 includes a control unit 10 that is connected to back-gate terminal BG of field-effect transistor T. Control unit 10 is set up to set drain current $I_D$ flowing through field-effect transistor T to a setpoint current via a controlling of back-gate voltage $V_{BG}$ at back-gate terminal BG. The controlling of back-gate voltage $V_{BG}$ is done as a function of at least the gate-source voltage $V_{GS}$.

Field-effect transistor system 1 has the advantage that undesirable parasitic effects can be compensated via the controlling of back-gate voltage $V_{BG}$. For example, the setpoint current can be selected such that the small signal drain-source resistance is correspondingly increased, thus improving the intrinsic gain of field-effect transistor T.

The present invention provides a feedback control system, or a control loop, in which at least gate-source voltage $V_{GS}$ acts as input variable in order to control back-gate voltage $V_{BG}$ as manipulated variable, and in this way to set the drain current to a setpoint current.

In addition, control unit 10 can also control back-gate voltage $V_{BG}$ as a function of drain-source voltage $V_{DS}$ at field-effect transistor T. For example, using drain-source voltage $V_{DS}$, for a given gate-source voltage $V_{GS}$ the region in which field-effect transistor T is operating can be determined, for example whether field-effect transistor T is in saturation region 50 or in linear region 40.

Control unit 10 can for example be set up to directly detect, or acquire, the drain-source voltage $V_{DS}$ and gate-source voltage $V_{GS}$ at field-effect transistor T. Alternatively, these can also be acquired by a corresponding measuring unit (not explicitly shown) and provided to control unit 10.

In particular, the setpoint current in saturation region 50 of field-effect transistor T can be independent of drain-source voltage $V_{DS}$. In this way, back-gate voltage $V_{BG}$ is controlled as a function of the input variable in such a way that drain current $I_D$ correspondingly agrees with this constant setpoint current. In this way, the intrinsic gain can be maximized.

In this particular specific embodiment, the controlling of back-gate voltage $V_{BG}$ takes place only as a function of gate-source voltage $V_{GS}$ and back-gate voltage $V_{BG}$; the present invention is not limited thereto.

In this specific embodiment shown as an example, control unit 10 is in addition set up to control back-gate voltage $V_{BG}$ of field-effect transistor T from a known electrical behavior of field-effect transistor T. For this purpose, for example data sets from field-effect transistor T that describe the electrical behavior of field-effect transistor T can be stored in a memory 15. Control unit 10 can then access this memory 15. For example, control unit 10 can include an internal memory 15 in which corresponding data are stored concerning the electrical behavior of field-effect transistor T. For example, the data can indicate the output characteristic curves in the form of an $I_D(V_{DS})$ functional relationship for various values of gate-source voltages $V_{GS}$, similar to FIG. 1.

Control unit 10 can then determine a suitable correction variable for back-gate voltage $V_{BG}$ by acquiring gate-source voltage $V_{GS}$ and, optionally, drain-source voltage $V_{DS}$, through comparison with the known behavior. In this way, a desired setpoint current, which is for example constant in saturation region 50, can then correspondingly be set by field-effect transistor 1 via back-gate voltage $V_{BG}$. In this specific embodiment, it is advantageous that drain-current $I_D$ does not explicitly have to be ascertained as input variable. However, compared to the embodiment shown in FIG. 3, an increased design outlay and a complicated control design for control unit 10 are required.

Figure 4:
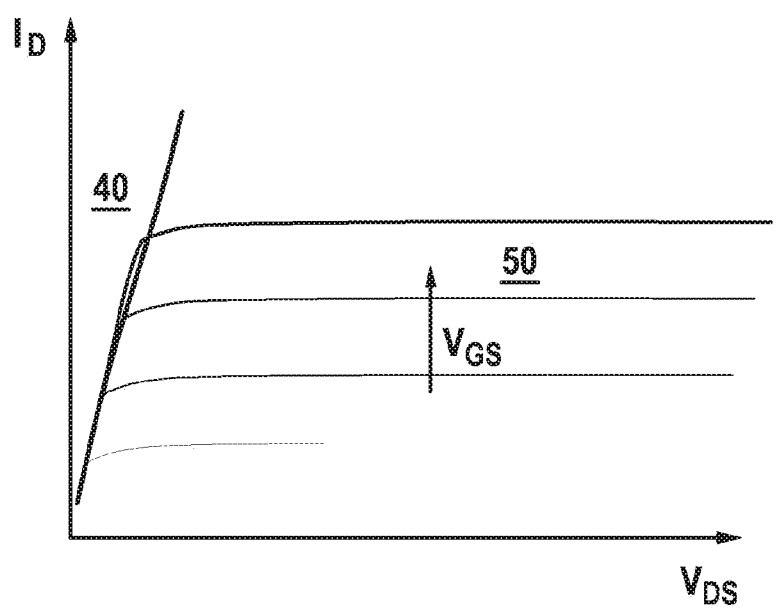
FIG. 4 shows an example of an output characteristic curve field of a field-effect transistor system according to the present invention.

An example of an output characteristic curve field of such a field-effect transistor system 1 is shown for example in FIG. 4.

Such a field-effect transistor system 1 can be integrated in an electrical circuit, as is shown as an example in FIG. 2. In the present example, the electrical circuit is realized as an amplifier circuit 100. This amplifier circuit 100 is designed in the form of a typical source circuit, the present invention not being limited to a particular circuit. In this embodiment, amplifier circuit 100 includes an operating voltage $V_{DS}$ that is connected via a load resistor R1 to drain terminal D of field-effect transistor T. A part of operating voltage $V_{DS}$ is thus always dropped at load resistor R1. Here, load resistor R1 also limits drain current $I_D$. The input voltage of this amplifier circuit 100 is applied at gate terminal G of field-effect transistor T in this embodiment. An amplified output voltage $V_{out}$ of amplifier circuit 100 can then be picked off at drain terminal D. Field-effect transistor system 1 can thus be used in the place of a standard field-effect transistor from the related art, the electrical circuit, in this case the amplifier circuit, having no, or reduced, parasitic behavior in comparison with a circuit from the related art.

Figure 3:
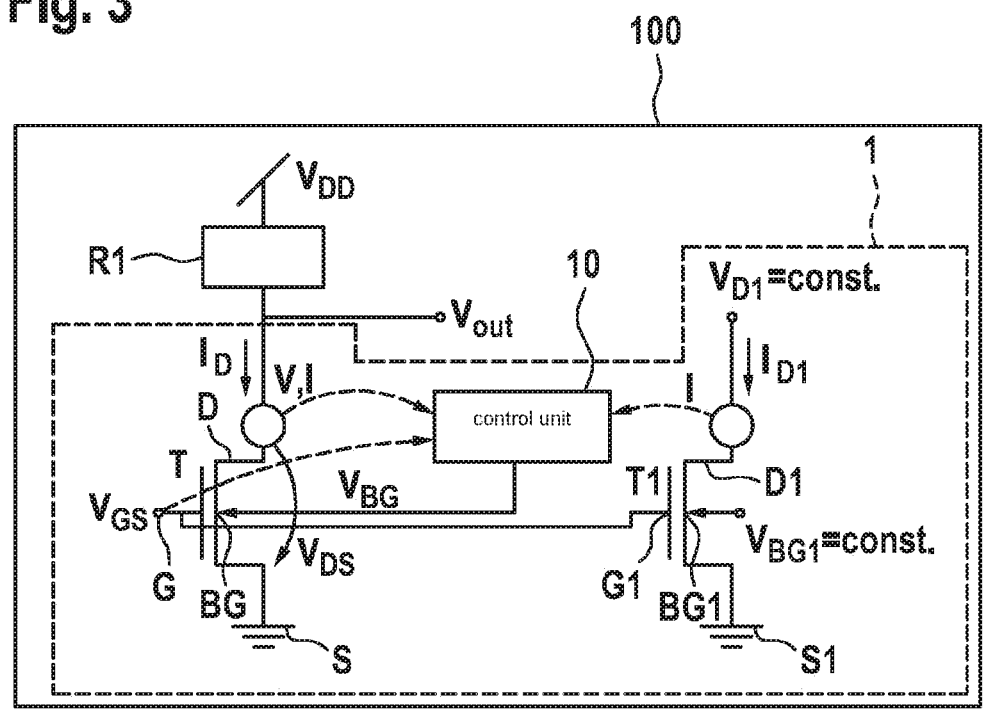
FIG. 3 shows a field-effect transistor system according to a second specific embodiment of the present invention.

FIG. 3 shows a field-effect transistor system 1 according to a second specific embodiment of the present invention. In the following, the differences from the specific embodiment described in FIG. 2 are described in more detail. For the features in common, reference is made to the description relating to FIG. 2.

As in the specific embodiment of FIG. 2, field-effect transistor system 1 includes a control unit 10 that is connected to back-gate terminal BG of field-effect transistor T. Control unit 10 is set up to set drain current $I_D$ flowing through field-effect transistor T to a setpoint current via a controlling of back-gate voltage $V_{BG}$ at back-gate terminal BG. In this specific embodiment, the controlling of back-gate voltage $V_{BG}$ is done as a function of gate-source voltage $V_{GS}$ and, in addition, as a function of drain current $I_D$ through field-effect transistor T. Optionally, in this specific embodiment the controlling can also be done as a function of drain-source voltage $V_{DS}$. Drain current $I_D$ can be acquired for example by control unit 10, or can be measured by another measuring unit and supplied to control unit 10. In this way, control unit 10 is provided with all electrical information, namely concerning gate-source voltage $V_{GS}$ and drain-source voltage $V_{DS}$ and drain current $I_D$, for the realization of a control loop having a reference element.

In this preferred specific embodiment, a reference field-effect transistor T1 is used as reference element. In this specific embodiment, a gate-source voltage $V_{GS1}$, which is identical to gate-source voltage $V_{GS}$ of field-effect transistor T, is present at reference field-effect transistor T1.

In the present specific embodiment, this agreement is realized by a source terminal S1 of reference field-effect transistor T1 that is grounded, as is source terminal S, and in addition is at a potential due to an electrical connection of gate terminal G of field-effect transistor T to a gate terminal G1 of reference field-effect transistor T1. Due to the coupling of gates G, G1, their electrical potentials are thus always identical. Because source terminals S, S1 are also at the same potential, because they are both grounded, the same gate-source voltage $V_{GS}=V_{GS1}$ is always present at reference field-effect transistor T1 and at field-effect transistor T.

In this specific embodiment, in addition a constant drain-source voltage $V_{DS1}$ and a constant back-gate voltage $V_{BG1}$ are always applied at reference field-effect transistor T1. As a result, a drain current $I_{D1}$ that is a function only of gate-source voltage $V_{Gs}$ flows through reference field-effect transistor T1 to source terminal S1. Thus, this drain current $I_{D1}$ is independent of drain-source voltage $V_{DS}$.

Control unit 10 can then control back-gate voltage $V_{BG}$ at field-effect transistor T in such a way that drain current $I_D$ through reference field-effect transistor T1 is identical to drain current $I_{D1}$ through field-effect transistor T. As a result, in addition drain current $I_D$ is also independent of drain-source voltage $V_{DS}$. Drain current $I_{D1}$ thus corresponds to the setpoint current of the control loop.

Through this realization, the output characteristic curves can thus be held constant in saturation region 50 of field-effect transistor 1; see also for example FIG. 4.

Field-effect transistor system 1 can be integrated in an electrical circuit, for example an amplifier circuit 100; see the embodiment in the description relating to FIG. 2.

FIG. 4 shows an example of an output characteristic curve field of a field-effect transistor system 1 according to the present invention. Here, a drain current $I_D$ is plotted as a function of drain-source voltage $V_{DS}$ for a multiplicity of different gate-source voltages $V_{GS}$.

The functional curve of drain current $I_D$ for each gate-source voltage $V_{GS}$ shows, as in FIG. 1 of the related art, a linear region 40 for sufficiently small drain-source voltages $V_{DS}$, and a saturation region 50 for sufficiently large drain-source voltages $V_{DS}$, the respective regions being separated by a separating line for clarity.

In contrast to the output characteristic curves shown in FIG. 1, the output characteristic curves in the region of saturation region 50 show an almost constant curve as a function of drain-source voltage $V_{DS}$, or an at least significantly reduced rise. In other words, drain current $I_D$ is independent of drain-source voltage $V_{DS}$. Advantageously, this results in a correspondingly increased small signal drain-source resistance $r_{DS}$ and thus also an improved intrinsic gain $A_i$.

Although the present invention has been illustrated and described in detail in relation to preferred exemplary embodiments, the present invention is not limited by the disclosed examples, and other variations can be derived therefrom by a person skilled in the art without departing from the scope of the present invention.

What is claimed is:

1. A field-effect transistor system, comprising:
   a field-effect transistor having a back-gate terminal that can be adjusted by a back-gate voltage, a gate-source voltage and a drain-source voltage being present at the field-effect transistor, and a drain current flowing through the field-effect transistor; and
   a control unit connected to the back-gate terminal, the control unit configured to set the drain current flowing through the field-effect transistor to a setpoint current by controlling the back-gate voltage at the back-gate terminal, the controlling of the back-gate voltage taking place as a function of at least the gate-source voltage,
   wherein the control unit includes a memory to store data describing an electrical behavior of the field-effect transistor, and is configured to control the back-gate voltage of the field-effect transistor using the data.

2. The field-effect transistor system as recited in claim 1, wherein the control unit is configured to control the back-gate voltage as a function of the drain-source voltage at the field-effect transistor.

3. The field-effect transistor system as recited in claim 1, wherein the setpoint current is independent of the drain-source voltage in a saturation region of the field-effect transistor.

4. The field-effect transistor system as recited in claim 1, wherein the control unit is configured to control the back-gate voltage as a function of the drain current through the field-effect transistor.

5. The field-effect transistor system as recited in claim 1, wherein the data describing the electrical behavior of the field-effect transistor includes a set of characteristic curves of the drain current as a function of the drain-source voltage for a plurality of different values of the gate-source voltage.

6. A field-effect transistor system, comprising:
   a field-effect transistor having a back-gate terminal that can be adjusted by a back-gate voltage, a gate-source voltage and a drain-source voltage being present at the field-effect transistor, and a drain current flowing through the field-effect transistor;
   a control unit connected to the back-gate terminal, the control unit configured to set the drain current flowing through the field-effect transistor to a setpoint current by controlling the back-gate voltage at the back-gate terminal, the controlling of the back-gate voltage taking place as a function of at least the gate-source voltage, wherein the control unit is configured to control the back-gate voltage as a function of the drain current through the field-effect transistor; and
   a reference field-effect transistor at which a gate-source voltage is present that is the same as the gate-source voltage of the field-effect transistor, and a constant drain-source voltage and a constant back-gate voltage being present at the reference field-effect transistor.

7. The field-effect transistor system as recited in claim 6, wherein the control unit is configured to control the back-gate voltage of the field-effect transistor from a known electrical behavior of the field-effect transistor.

8. The field-effect transistor system as recited in claim 6, wherein the control unit is configured to control the back-gate voltage at the field-effect transistor in such a way that a drain current through the reference field-effect transistor is identical to the drain current through the field-effect transistor.

9. The field-effect transistor system as recited in claim 6, wherein the control unit includes a memory to store data describing an electrical behavior of the field-effect transistor, and is configured to control the back-gate voltage of the field-effect transistor using the data.

10. An electrical circuit, comprising:
    an amplifier circuit including one or more field-effect transistor systems, each of the one or more of the field-effect transistor systems including:
       a field-effect transistor having a back-gate terminal that can be adjusted by a back-gate voltage, a gate-source voltage and a drain-source voltage being present at the field-effect transistor, and a drain current flowing through the field-effect transistor; and
       a control unit connected to the back-gate terminal, the control unit configured to set the drain current flowing through the field-effect transistor to a setpoint current by controlling the back-gate voltage at the back-gate terminal, the controlling of the back-gate voltage taking place as a function of at least the gate-source voltage,
       wherein the control unit includes a memory to store data describing an electrical behavior of the field-effect transistor, and is configured to control the back-gate voltage of the field-effect transistor using the data.

11. A method for setting a drain current of a field-effect transistor, comprising the following steps:
    providing a field-effect transistor having a back-gate terminal that can be adjusted by a back-gate voltage, a gate-source voltage and a drain-source voltage being present at the field-effect transistor, and a drain current flowing through the field-effect transistor;
    setting the drain current flowing through the field-effect transistor to a setpoint current via a controlling of the back-gate voltage at the back-gate terminal by a control unit connected to the back-gate terminal, the controlling of the back-gate voltage taking place as a function of at least the gate-source voltage,
    wherein the control unit includes a memory to store data describing an electrical behavior of the field-effect transistor, and controls the back-gate voltage of the field-effect transistor using the data.

12. The method as recited in claim 11, wherein the controlling of the back-gate voltage takes place as a function of the drain-source voltage.

13. The method as recited in claim 11, wherein the setpoint current in a saturation region of the field-effect transistor is independent of the drain-source voltage.

14. The method as recited in claim 11, wherein the controlling of the back-gate voltage takes place as a function of the drain current flowing through the field-effect transistor.

15. The method as recited in claim 14, further comprising the following step:
provide a reference field-effect transistor at which a gate-source voltage is applied that is the same as the gate-source voltage of the field-effect transistor, a constant drain-source voltage and a constant back-gate voltage being applied at the reference field-effect transistor.

16. The method as recited in claim 15, wherein the controlling of the back-gate voltage by the control unit takes place in such a way that a drain current through the reference field-effect transistor is identical to the drain current through the field-effect transistor.

* * * * *